(12) United States Patent
Ueno et al.

(10) Patent No.: US 6,228,457 B1
(45) Date of Patent: May 8, 2001

(54) OPTICAL DATA STORAGE MEDIUM

(75) Inventors: Takashi Ueno, Tokyo; Keiichiro Jinushi, Tochigi; Katsuhisa Aratani, Chiba; Masaaki Iwasaki; Ryohei Miyake, both of Shizuoka, all of (JP)

(73) Assignees: Furuyametals Co. Ltd.; Sony Corporation; Sony Disc Technology Inc., all of Tokyo (JP)

( * ) Notice: Subject to any disclaimer, the term of this patent is extended or adjusted under 35 U.S.C. 154(b) by 0 days.

(21) Appl. No.: 09/399,108

(22) Filed: Sep. 20, 1999

(30) Foreign Application Priority Data

Mar. 30, 1999  (JP) ................................ 11-089071

(51) Int. Cl.⁷ ...................................... B32B 3/00
(52) U.S. Cl. ................ 428/64.1; 428/64.2; 428/64.4; 428/427; 428/913; 430/270.11; 430/495.1; 430/945; 283/288
(58) Field of Search ................. 428/64.1, 64.2, 428/64.4, 457, 913; 430/270.11, 495.1, 945; 369/283, 288

(56) References Cited

U.S. PATENT DOCUMENTS 6,007,889 * 12/1999 Nee ..................................... 428/64.1

FOREIGN PATENT DOCUMENTS 56-105494 * 8/1981 (JP) .
57-203786 * 8/1981 (JP) .

* cited by examiner

*Primary Examiner*—Elizabeth Evans
(74) *Attorney, Agent, or Firm*—Sonnenschein Nath & Rosenthal (57) ABSTRACT

There is disclosed an optical data storage medium in which the weather resistance of the semitransparent reflective film is improved and the adhesive property between the semitransparent reflective film and a substrate is enhanced, and which has a higher reliability. In an optical data storage medium (6), on the side on which a reproduction light (8) is incident, a first information layer (9) is located while on the side opposite to the side on which the reproduction light (8) is incident, a second information layer (10) is located. A semitransparent reflective film (3) of first information layer (9) is AgPdCu alloy thin films containing 0.5 to 3.0 weight % Pd and 0.1 to 3.0 weight % Cu or AgPdTi alloy thin films containing 0.5 to 3.0 weight % Pd and 0.1 to 3.0 weight % Ti. At the wavelength 650 nm, the optimum film thickness of AgPdCu alloy thin film is 5 to 18 nm and the optimum film thickness of AgPdTi alloy thin film is 10 to 25 nm. At the wavelength 450 nm, the optimum film thickness of AgPdCu alloy thin film is 10 to 25 nm, and the optimum film thickness of AgPdTi alloy thin film is 15 to 25 nm.

6 Claims, 3 Drawing Sheets

OPTICAL DATA STORAGE MEDIUM

BACKGROUND OF THE INVENTION

1. Field of the Invention

The present invention relates to an optical data storage medium, and more specifically to an optical data storage medium having a semitransparent reflective film on at least one information layer.

2. Description of the Related Art

An optical disk, exemplified by a DVD (Digital Versatile Disk) and the like, comprises two 0.6 mm thick transparent plastic substrates bonded face to face such that information layers comprised of concave and convex pits formed on the substrates constitute the bonded surfaces.

Among read-only DVD's, there is a so-called two-layer disk in which the two substrates have different informations stored in advance.

At the time of reproduction of the two-layer disk, since the reproduction is carried out by reproducing light incident on either one of the two disks, the access to the two different information layers can be advantageously made in a short period of time. The reflective layer of the first information layer on the incidence side of reproducing light is designed such that a proportion of the incident light is reflected and the rest of the incident light is transmitted therethrough. Because of this, the reproducing light can reach the second information layer present at a position distant from the incidence side of the light. The light reflected from the second information layer can be passed through the reflective layer of the first information layer and thus the reproduction of the second information layer is made possible.

The first information layer and the second information layer have a space therebetween by a transparent bonding material which is called a spacer in order not to cause interference between the respective reproducing signals. Therefore, it is possible to obtain high-quality information of reproduction from each of the two layers by setting the focal position of an object lens to the positions coincident with the respective information layers. In order to realize the above-described reproduction system, the design of the reflective film on the first information layer is very important. This reflective film, which transmits a proportion of the light, is hereinafter referred to as a semitransparent reflective film.

Heretofore, Au or Si has been generally used as a material for the semitransparent reflective film, because these substances meet the requirements for optical characteristics such as desired reflectance, desired transmittance or the like and because a thin film of these substances can be easily formed by, for example, sputtering method or the like. Additional advantages are that these substances provide a stable covering to the fine concave and,convex pits formed on the information layer and that these substances as optical storage media exhibit excellent weather resistance.

These substances, however, are associated with problems. In the case of Au, the material cost is high. Although Si is a relatively cheap material, its adhesion to a transparent adhesive and to a plastic substrate is so weak that the resistance to bending, warping, moisture absorption, and the like is not reliably sufficient. Furthermore, in comparison with metals, Si films deposited inside a sputtering chamber easily come off and produce a larger amount of particles in the sputtering process apparatus. As a result, the error rate becomes worse.

In order to solve these problems, Ag is studied as a substitute material for Au and Si.

However, since Ag is reactive to chlorine, sulfur, compounds thereof, and ions thereof, Ag is easily corroded if seawater, sweat or the like penetrates through the substrate.

In view of the above-mentioned problems, Japanese Patent Application Laid-Open (JP-A) Nos. 57-186,244, 7-3,363, and 9-156,224 disclose a technique wherein the weather resistance of Ag is improved by the addition of specific impurities thereto.

More specifically, JP-A No. 57-186,244 discloses an AgCu alloy (the content of Ag is 40 atomic % or more); JP-A No. 7-3,363 discloses an AgMg alloy (the content of Mg is equal to or more than 1 to 10 atomic %); and JP-A No. 9-156,224 discloses an AgOM (M being Sb, Pd, or Pt) alloy (the content of 0 is 10 to 40 atomic % and the content of M is 0.1 to 10 atomic %).

However, the weather resistance of these alloys, and the reflectance and transmittance of the thin film formed from these alloys are not completely elucidated. Particularly, the properties of these alloys in a thin film region for use as a semitransparent reflective film are not yet studied.

SUMMARY OF THE INVENTION

In view of the foregoing problems, an object of the present invention is to provide a highly reliable optical data storage medium in which the weather resistance of the semitransparent reflective film is improved and the adhesion between the semitransparent reflective film and the substrate is upgraded.

Another object of the present invention is to provide an optical data storage medium which enables a stable reproduction.

An optical data storage medium of the present invention comprises a total of two or more layers in which an information layer having a semitransparent reflective film and an information layer having a reflective film are laminated, said optical date storage medium being capable of performing at least one operation selected from recording of information and reproduction of information by light radiation from the same direction, wherein the semitransparent reflective film comprises a thin film of an AgPdCu alloy containing 0.5 to 3.0 weight % Pd and 0.1 to 3.0 weight % Cu.

Alternatively, an optical data storage medium of the present invention comprises a total of two or more layers in which an information layer having a semitransparent reflective film and an information layer having a reflective film are laminated, said optical date storage medium being capable of performing at least one operation selected from recording of information and reproduction of information by light radiation from the same direction, wherein the semitransparent reflective film comprises a thin film of an AgPdTi alloy containing 0.5 to 3.0 weight % Pd and 0.1 to 3.0 weight % Ti.

According to the optical data storage medium of the present invention, the use as the semitransparent reflective film of a thin film of an AgPdCu alloy containing 0.5 to 3.0 weight % Pd and 0.1 to 3.0 weight % Cu or of a thin film of an AgPdTi alloy containing 0.5 to 3.0 weight % Pd and 0.1 to 3.0 weight % Ti makes it possible to prevent changes in optical characteristics such as increase in transmittance or the formation of black stains in an atmosphere at high temperature and high humidity, to prevent the film from becoming whitish dull when immersed in salt water, and to prevent the Ag thin film from being partly lifted from the substrate due to the penetration of salt water between the Ag thin film and the substrate.

DETAILED DESCRIPTION OF THE PREFERRED EMBODIMENT

Referring now to FIGS. 1 to 4 and Tables 1 to 3, embodiments of the present invention will be explained below.

First of all, an optical data storage medium according to the present invention will be described.

Figure 1:
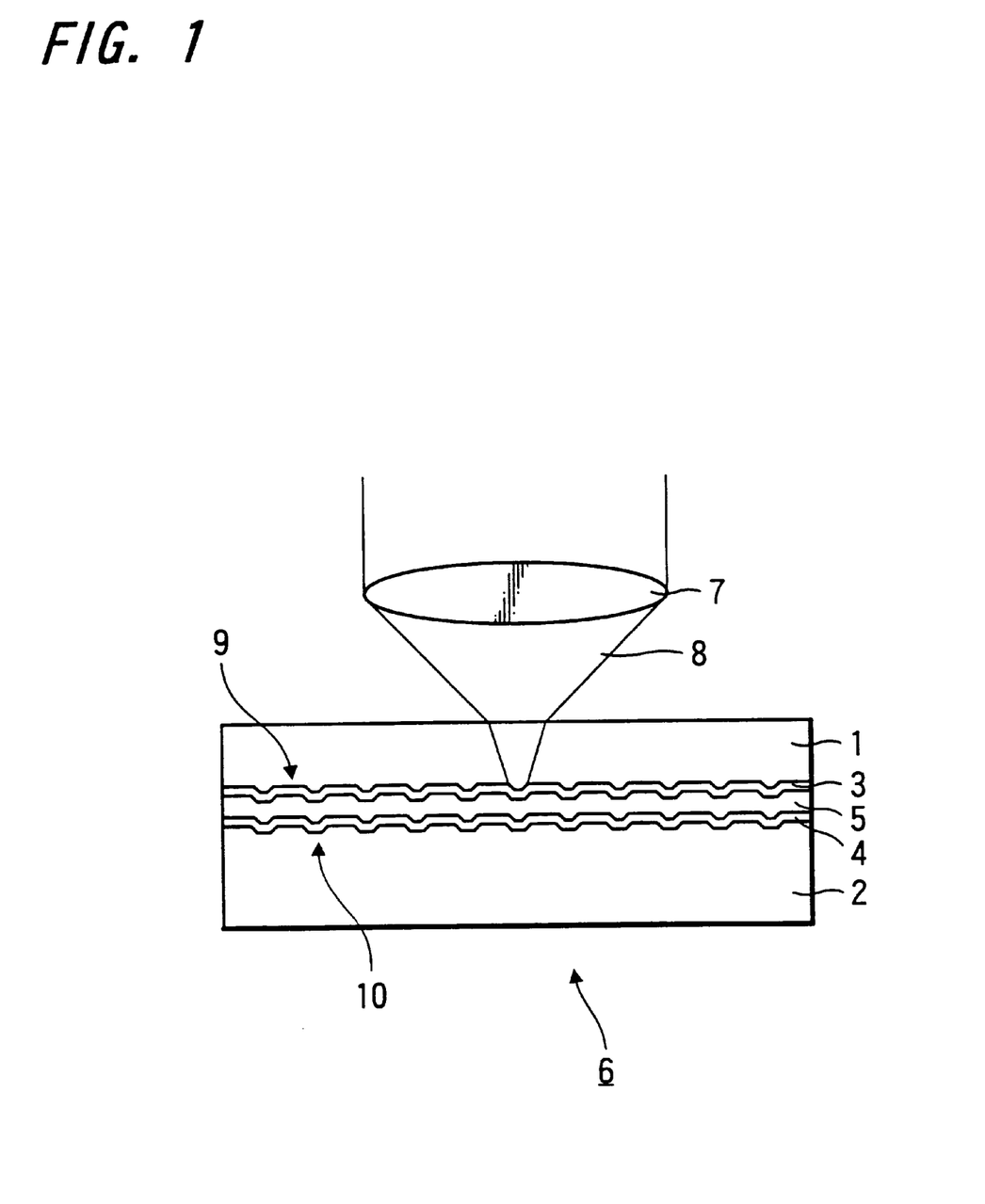
FIG. 1 is a side view showing an example of the optical data storage medium according to the present invention.

FIG. 1 is a side view showing an example of the optical data storage medium according to the present invention. An optical data storage medium 6 according to this example is a high-density optical data storage medium called a DVD.

The optical data storage medium 6 has a transparent substrate 1 in the upper region and a transparent to opaque substrate 2 in the lower region, as seen in the drawing. These substrates 1 and 2 are made from, for example, plastics such as polycarbonate and the like.

On one face of the substrate 1, there is provided a first information layer 9, which is made up of an information pit and a semitransparent reflective film 3. The information pit has, for example, concave and convex patterns formed according to information.

On one face of the substrate 2, as with the substrate 1, there is provided a second information layer 10, which is made up of an information pit and a reflective film 4.

The face of the first substrate 1 having the information layer 9 formed thereon and the face of the second substrate 2 having the information layer 10 formed thereon are bonded together by a transparent adhesive 5 having a predetermined thickness. By this structure, an integrated optical data storage medium having the two information layers 9 and 10 is formed.

As a result, the first information layer 9 is disposed on the side which is to be irradiated with a reproducing light 8, and the second information layer 10 is disposed on the side opposite to the side which is to be irradiated with the reproducing light 8.

Referring to the optical data storage medium 6 of FIG. 1, a method for reproducing a signal will be explained below.

In the optical data storage medium 6 of FIG. 1, the reproduction of the signal of the first information layer 9 is carried out by converging the reproducing light 8 incident on the first substrate 1 on the first information layer 9. On the other hand, the reproduction of the signal of the second information layer 10 is carried out by shifting the focal position of an object lens 7 to the second information layer 10 so that the reproducing light 8 is converged on the second information layer 10.

Upon the reproduction of the signal of the second information layer 10, the reproducing light 8 needs to pass through the first information layer 9. To this end, a so-called semitransparent reflective film is used as the first information layer 9. The semitransparent reflective film has such a property to reflect a proportion of the incident light but transmit the rest of the incident light.

By reason of, for example, ease in fabrication or the like, the semitransparent reflective film 3 of the first information layer 9 is formed by the sputtering method and generally by the magnetron sputtering. Meanwhile, the semitransparent reflective film 4 of the second information layer 10 is formed as in the case of conventional reflective films by the above-mentioned sputtering method made of Al, Au, Ag having a high reflectance, or alloys thereof.

Next, the semitransparent reflective film 3 of the first information layer 9 is explained in detail.

When the semitransparent reflective film 3 is formed, the reflectance R1 (%) thereof generally increases while the transmittance T1 (%) thereof decreases, as the film thickness thereof increases. Besides the light which is reflected and the light which is transmitted, a proportion of the light is absorbed by the film. The proportion of the light which is absorbed is referred to as the absorbance A1. Therefore, if the quantity of the light incident on the semitransparent reflective film 3 is taken as 100 (%), the following equation is established.

$$R1 + T1 + A1 = 100\ (\%) \tag{1}$$

In order to ensure good reproduction in the optical data storage medium comprising the two information layers 9 and 10 mentioned above, the quantity of a returning light S1 (%) from the first information layer 9 and the quantity of a returning light S2 (%) from the second information layer 10 need to be sufficiently large. These values S1 and S2 are proportional to the respective reflectances R1 and R2 of the information layers 9 and 10.

In the case of a ROM (read-only memory) data storage medium to be used exclusively for reproduction, the reproduction is possible if the reflectance is equal to or more than about 10%. This is because, if the reflectance is less than about 10%, it is difficult to distinguish between the reflected light created on the interface of the disk surface and air and the reflected light coming from the information layer, thereby making it impossible to carry out the focus control.

Since the semitransparent reflective film 3 is disposed on the side to be irradiated with the reproducing light 8, the quantity of returning light S1 is a signal congruent with a quantity proportionate straight to the reflectance R1 of the semitransparent reflective film 3. The quantity of returning light S1 can be taken as equal to the reflectance R1, because the light absorption by the substrate 1 is very small.

On the other hand, the influence of the semitransparent reflective film 3 present in the pathway makes the quantity of returning light S2 a little complex. Therefore, in order to clarify the relationship, the influence of the semitransparent reflective film 3 on the quantity of returning light S2 is sought by calculation.

Of the quantity of light incident on the semitransparent reflective film 3, the proportion of the light which passes through the semitransparent reflective film 3 and reaches the second information layer 10 is expressed by the transmittance $T1(=100-R1-A1)$ of the semitransparent reflective film 3. Further, of the quantity of light which reaches the second information layer 10, the proportion of the light which is reflected by the reflective film 4 of the second information layer 10 is expressed by the reflectance R2 of the reflective film 4. Furthermore, of the quantity of light reflected by the reflective film 4 of the second information layer 10, the proportion of the light which passes through the semitransparent reflective film 3 is expressed by the transmittance T1 of the semitransparent reflective film 3. Thus, the quantity of light which passes through the semitransparent reflective film 3 of the first information layer 9 is the quantity of returning light.

Accordingly, the quantity of returning light can be expressed by $(T1 \times R2 \times T1)/10000$ or $(100-R1-A1)^2 \times R2/10000$. Consequently, the quantity of returning light S2 from the second information layer 10 can be expressed by the following equation:

$$S2 = (100-R1-A1)^2 \times R2/10000 \tag{2}$$

Taking as an example a semitransparent reflective film 3 composed of Ag, the above-described equation is studied. If the wavelength to be employed in measurement is taken as 650 nm, and the thickness of the semitransparent reflective film 3 is taken as 10 nm, the reflectance R1 is 26% and the absorbance A1 is 13%. Further, if the reflectance R2 of the second information layer 10 is 80%, the quantity of returning light S2 is 30%. Based on the above, the quantity of returning light S1 is 26% and the quantity of returning light S2 is 30%. Since both of the quantities of returning light S1 and S2 are more than 10%, sufficient signals can be obtained.

Next, the results of examination of the weather resistance carried out on the semitransparent reflective film 3 of the optical data storage medium are given below.

In comparison with film thicknesses of prior art reflective films, the film thickness of the semitransparent reflective film 3 is in a very thin film region. Therefore, the semitransparent reflective film 3 needs to have sufficient weather resistance.

In the present invention, first, a sputtering target of an AgPdCu alloy in which Pd and Cu made up the solute portion in Ag was prepared. Then, a sputtering target of an AgPdTi alloy in which Pd and Ti made up the solute portion in Ag was prepared.

Next, by using any one of the above-described sputtering targets, a thin semitransparent reflective film of the alloy was prepared. In this way, an optical data storage medium was obtained.

The Pd-containing Ag alloy was selected as the sputtering target material, because the difference between the specific gravity of Pd, i.e., 12.0 (g/cm$^3$), and the specific gravity of Ag, i.e., 10.5 (g/cm$^3$), is small. The above-described smallness in difference of specific gravity prevents the segregation of Pd as an alloying element from overall alloy in the alloy production process ranging from a melting step to a cooling/solidification step and facilitates the production of a sputtering target having a homogeneous composition. Another advantage is that no intermetallic compound is formed during the process of the alloy production.

Since Ag is reactive with sulfur, Ag becomes black by the formation of silver sulfide ($Ag_2S$) if Ag is left to stand in the atmosphere for a long period of time. As a result, the optical properties of the Ag thin film are degraded. Further, Ag vigorously reacts with chlorine and becomes whitish-dull by the formation of silver chloride (AgCl). As a result, the optical properties of the Ag thin film are degraded. In contrast, Ag is a substance which is relatively stable to oxygen, hydrogen, and water.

On the other hand, Pd is stable to sulfur and chlorine unless heated to a high temperature. Accordingly, Pd is a substance which is chemically stable to sulfur and chlorine.

Furthermore, if a blend comprising Ag and a certain amount of Pd is melted and thereafter the composition is cooled, Pd can be uniformly dispersed at and penetrated in Ag grain boundaries. Therefore, in an AgPd alloy, the synergism between Ag, which is resistant to oxygen and hydrogen, and Pd, which is resistant to chlorine and sulfur, provides the AgPd alloy with better resistance to nonmetallic contaminants such as chlorine, hydrogen, oxygen, and sulfur to be encountered in the atmosphere or in a specific environment and better weather resistance in the environment and atmosphere required for a resulting optical data storage medium.

The testing method of weather resistance is described below. The testing method employed consisted of a high-temperature and high-humidity test and a chlorine-resistance test.

The samples for the high-temperature and high-humidity test were AgPdCu alloy thin films and AgPdTi alloy thin films each serving as a semitransparent reflective film having a thickness of 10 nm formed by the sputtering method on smooth glass substrates.

The high-temperature and high-humidity test was conducted by exposing the samples for one hour to steam produced from boiling water.

Samples for the chlorine-resistance test had the same construction as that of the optical data storage medium shown in FIG. 1 except that the substrate 2 was absent. That is, the sample was prepared by the steps of forming a 10 nm thick film of an AgPdCu alloy or an AgPdTi alloy as a semitransparent reflective film by the sputtering method on a polycarbonate substrate having thereon concave and convex pits corresponding to data and then covering the semitransparent reflective film with a UV-curable acrylic resin serving as a transparent adhesive.

The chlorine-resistance test was conducted by immersing the samples for 240 hours in a 5% sodium chloride aqueous solution.

Table 1 shows the results of the high-temperature and high-humidity test and the chlorine-resistance test of AgPdCu alloy thin films and AgPdTi alloy thin films.

TABLE 1

| material composition(wt %) | Result of high-temperature and high-humidity test | Result of chlorine test |
|---|---|---|
| Ag | Optical property change (Increase of transmittance) | Large whitish dullness, lifting of film from substrate |
| $Ag_{99.0} Pd_{1.0}$ | no change | lifting of film from substrate |
| $Ag_{97.5} Pd_{2.5}$ | Moderate development of black stain | lifting of film from substrate |
| $Ag_{95.5} Pd_{4.5}$ | Large increase of black stain | lifting of film from substrate |
| $Ag_{99.8} Pd_{0.1} Cu_{0.1}$ | no change | small whitish dullness |
| $Ag_{99.4} Pd_{0.5} Cu_{0.1}$ | no change | no change |
| $Ag_{98.9} Pd_{1.0} Cu_{0.1}$ | no change | no change |
| $Ag_{97.9} Pd_{2.0} Cu_{0.1}$ | no change | no change |
| $Ag_{96.9} Pd_{3.0} Cu_{0.1}$ | no change | no change |
| $Ag_{96.4} Pd_{3.5} Cu_{0.1}$ | slight development of black stain | no change |
| $Ag_{96.5} Pd_{3.0} Cu_{0.5}$ | no change | no change |
| $Ag_{94.0} Pd_{3.0} Cu_{3.0}$ | no change | no change |
| $Ag_{99.8} Pd_{0.1} Ti_{0.8}$ | no change | small whitish dullness |
| $Ag_{99.4} Pd_{0.5} Ti_{0.1}$ | no change | no change |

TABLE 1-continued

| material composition(wt %) | Result of high-temperature and high-humidity test | Result of chlorine test |
|---|---|---|
| $Ag_{98.9}Pd_{1.0}Ti_{0.1}$ | no change | no change |
| $Ag_{97.9}Pd_{2.0}Ti_{0.1}$ | no change | no change |
| $Ag_{96.9}Pd_{3.0}Ti_{0.1}$ | no change | no change |
| $Ag_{96.4}Pd_{3.5}Ti_{0.1}$ | slight development of black stain | no change |
| $Ag_{90.5}Pd_{3.0}Ti_{0.5}$ | no change | no change |
| $Ag_{94.0}Pd_{3.0}Ti_{3.0}$ | no change | no change |

The findings obtained from the high-temperature and high-humidity test are as follows.

In Ag thin films, change in optical property, more specifically the increase of transmittance, was observed.

In AgPd alloy thin films containing 2.5 to 4.5 weight % Pd, the development of black stain was observed. According to the observation under a microscope, it was found that the development of black stain was caused by the formation of minute protrusions. The formation of minute protrusions leads to the increase of error rate at the time of data reproduction and therefore poses a problem to practical use.

In AgPdCu alloy thin films containing 0.1 to 3.0 weight % Pd and 0.1 to 3.0 weight % Cu, no change was observed. However, in AgPdCu alloy thin films having a higher Pd content, i.e., 3.5 weight % Pd, black stains were observed.

Likewise, in AgPdTi alloy thin films containing 0.1 to 3.0 weight % Pd and 0.1 to 3.0 weight % Ti, no change was observed. However, in AgPdTi alloy thin films having a higher Pd content, i.e., 3.5 weight % Pd, black stains were observed.

As described above, the addition of Cu or Ti as a third element brought about the improvement of weather resistance and thus a higher reliability was obtained.

The findings obtained from the chlorine-resistance test are as follows.

In Ag thin films, whitish dullness of the film presumably due to chlorination was observed.

In addition, partial lifting of the Ag thin film, caused by the penetration of salt water between the Ag thin film and the substrate, was observed. This is presumably due to the weak adhesion between the Ag thin film and the plastic substrate.

In thin films of AgPd alloys, i.e., AgPd alloy thin films without the addition of Cu or Ti, partial lifting of the thin films, caused by the penetration of salt water between the AgPd thin film and the substrate, was observed regardless of Pd contents. This is presumably due to the weak adhesion between the AgPd thin film and the plastic substrate.

In thin films of AgPdCu alloys or AgPdTi alloys, whitish dullness due to partial corrosion of thin films were observed if the Pd content of the alloys was small, i.e., 0.1 weight % or less.

The above-mentioned whitish dullness and peeling from the substrate all lead to the increase of error rate at the time of data reproduction and therefore pose a problem to practical use.

In contrast, in thin films of AgPdCu alloys or AgPdTi alloys, peeling from the substrate was not observed if the alloys contained 0.1 to 3.0 weight % Pd and 0.1 to 3.0 weight % Cu or addition of Ti.

As described above, the addition of Cu or Ti as a third element brought about the improvement of weather resistance and thus a higher reliability was obtained.

Based on the results of the high-temperature and high-humidity test and the chlorine-resistance test, the thin film compositions effective in clearing both of these tests are an AgPdCu alloy containing 0.5 to 3.0 weight % Pd and 0.1 to 3.0 weight % Cu and an AgPdTi alloy containing 0.5 to 3.0 weight % Pd and 0.1 to 3.0 weight % Ti.

Sputtering target materials are described below.

In the preparation of sputtering target materials by the addition of Cu or Ti to Ag, complete solutionization of the Cu or Ti in Ag is difficult and the Cu or Ti content locally varies. Therefore, the Cu or Ti content varies also in the thin films of AgCu alloy or AgTi alloy formed from the sputtering target materials to the extent that stable weather resistance and optical properties cannot be obtained.

In contrast, it was found that the addition of Cu or Ti to an AgPd alloy resulted in relatively easy solutionization of Cu or Ti in the AgPd alloy. The formation of a solid solution of Pd with respective atoms of Ag, Cu, and Ti has been already confirmed. Therefore, presumably Pd acts as a solutionization aid to form a three-element complete solid solution by causing a primary solutionization reaction between difficultly solutionizable Ag and Cu or Ti and thereafter causing a secondary solutionization reaction between the primary solutionization product and the remaining other element.

The results of evaluation conducted with the semitransparent reflective film 3 of the optical data storage medium 6 are described below.

The method for evaluating the optical properties of the semitransparent reflective film was as follows.

AgPdCu alloy thin films and AgPdTi alloy thin films, each serving as a semitransparent reflective film, were prepared by the sputtering method on smooth glass substrates.

Then, by the irradiation of the front side of the semitransparent reflective film with parallel rays of light, reflectance, transmittance, and absorbance were measured.

The optical properties such as reflectance and so on obtained by the above-mentioned method differ from optical properties such as reflectance obtained by converging a laser light on the information layer of an optical data storage medium having the construction shown in FIG. 1. Details of this difference will be explained later.

In the measurement of the optical properties, the wavelengths employed were 400 nm and 650 nm. This is because 650 nm is the wavelength employed in ordinary optical disk systems while 400 nm is the wavelength of a blue semiconductor laser for high-density recording. It is important for the optical storage medium to have satisfactory optical properties at these wavelengths.

In addition, it is a practically important merit for an optical data storage medium to exhibit optical properties compatible with both of the wavelengths.

For example, if the film is designed to carry out stable reproduction of the first information layer 9 and the second information layer 10 at both of the wavelengths of 650 nm and 400 nm, a disk medium comprising the film and reproducible by an optical disk system using a red laser of 650 nm can be readily used for the reproduction by a system using a blue laser when the optical disk system using as a light source a blue laser having 400 nm is developed in the future.

Table 2 shows the results of measurements of reflectance, transmittance, and absorbance of semitransparent reflective films having typical compositions by using a wavelength of 650 nm.

TABLE 2

| Film thickness | Reflectance [%] | Ag Transmittance [%] | Absorbance [%] | Ag-Reflectance [%] | 1.2Wt 1.3Wt Transmittance [%] | %Pd-%Cu Absorbance [%] | Ag-Reflectance [%] | 1.2Wt 1.3Wt Transmittance [%] | %Pd-Ti Absorbance [%] |
|---|---|---|---|---|---|---|---|---|---|
| 5 mm | 17.0 | 70.8 | 12.2 | 18.5 | 68.5 | 13.0 | 19.5 | 66.5 | 14.0 |
| 10 nm | 35.5 | 51.2 | 13.3 | 34.0 | 51.5 | 14.5 | 33.5 | 51.4 | 15.1 |
| 15 nm | 46.5 | 37.0 | 16.5 | 43.5 | 38.3 | 18.2 | 44.0 | 38.5 | 17.5 |
| 20 nm | 61.0 | 20.0 | 19.0 | 58.5 | 20.5 | 21.0 | 57.7 | 21.8 | 20.5 |

As can be seen from Table 2, in each composition, the reflectance increases, the transmittance decrease, and the absorbance increases, as the film thickness increases. As for the values of reflectance of the materials at the same film thickness, a slight difference is observed depending on the film thicknesses. The addition of PdCu or PdTi generally causes slight reduction in the reflectance and increase in the absorbance. These differences, however, are very slight and may be regarded as differences of 1 nm or less in terms of film thickness. Therefore, the optical properties of these materials at 650 nm can be considered as nearly the same.

When calculating the quantity of returning light, the following correction was made because the film boundary condition of the samples used in the above-described optical experimentation differed from that of actual optical data storage media.

That is, a complex index of refraction was sought from the experimental results. Based on the value thus obtained, the medium, i.e., air, on the side to be irradiated with the reproducing light in the optical data storage medium shown in FIG. 1 was changed to a plastic substrate. In this way, the quantity of returning light S1 from the first information layer and the quantity of returning light S2 from the second information layer were calculated.

Figure 2:
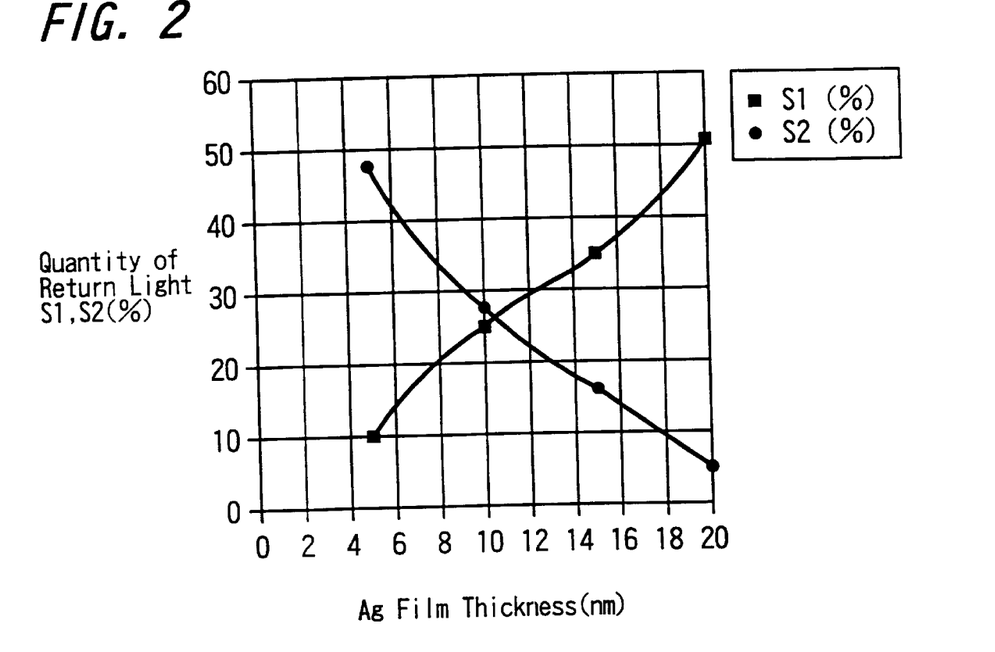
FIG. 2 is a graph which illustrates the relationship between the quantity of a returning light S1 and a film thickness as well as the relationship between the quantity of a returning light S2 and the film thickness in a thin film of Ag at a wavelength of 650 nm.

FIG. 2 is a graph which illustrates the relationship between the quantity of returning light S1 and film thickness as well as the relationship between the quantity of returning light S2 and film thickness in a thin film of Ag at a wavelength of 650 nm.

Figure 3:
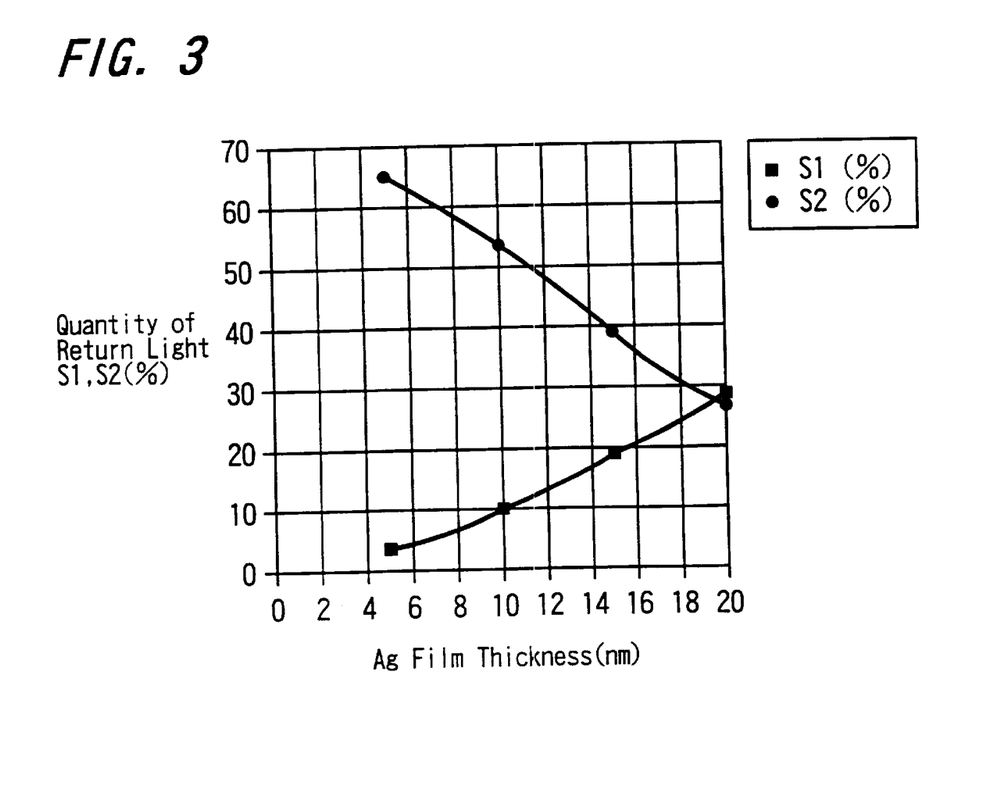
FIG. 3 is a graph which illustrates the relationship between the quantity of a returning light S1 and a film thickness as well as the relationship between the quantity of a returning light S2 and the film thickness in a thin film of Ag at a wavelength of 400 nm.

FIG. 3 is a graph which illustrates the relationship between the quantity of returning light S1 and film thickness as well as the relationship between the quantity of returning light S2 and film thickness in a thin film of Ag at a wavelength of 400 nm.

Based on FIG. 2, the condition for stable reproduction of data, i.e., the film thickness range which simultaneously satisfies $S1 \geq 10\%$ and $S2 \geq 10\%$, is found to be a range of from 5 to 18 nm.

Likewise, based on FIG. 3, the film thickness range is found to be 10 nm or greater. The upper limit is presumed to be 26 nm by way of extrapolation of the S2 curve.

Accordingly, in Ag thin films, the film thickness range of the semitransparent reflective film for stable reproduction of data is from 5 to 18 nm at a wavelength of 650 nm and from 10 to 26 nm at a wavelength of 400 nm. Further, the proper film thickness range of the semitransparent reflective film for stable reproduction of data at both wavelengths of 650 nm and 400 nm is from 10 to 18 nm.

Table 3 shows the results obtained by measuring, at a wavelength of 400 nm or 650 nm, the optical properties of 10 nm thick AgPdCu films and AgPdTi films having various compositions. The measuring method was the same as that using glass samples.

TABLE 3

| | Wavelength of 400 nm | | | Wavelength of 650 nm | | |
|---|---|---|---|---|---|---|
| | Reflectance [%] | Transmittance [%] | Absorbance [%] | Reflectance [%] | Transmittance [%] | absorbance [%] |
| Ag | 15.4 | 75.8 | 8.8 | 35.5 | 51.2 | 13.3 |
| Ag-0.1%Pd-0.1%Cu | 15.5 | 76.5 | 8.0 | 36.7 | 52.5 | 10.8 |
| Ag-0.5%Pd-0.1%Cu | 15.8 | 76.8 | 7.4 | 36.7 | 52.7 | 10.6 |
| Ag-1.0%Pd-0.1%Cu | 16.2 | 75.9 | 7.9 | 36.5 | 52.6 | 10.9 |
| Ag-1.5%Pd-0.1%Cu | 14.9 | 76.1 | 9.0 | 35.8 | 51.9 | 12.3 |
| Ag-2.0%Pd-0.1%Cu | 15.2 | 75.3 | 9.5 | 35.3 | 52.3 | 12.4 |
| Ag-2.5%Pd-0.1%Cu | 16.5 | 75.2 | 8.3 | 34.9 | 52.5 | 12.6 |
| Ag-3.0%Pd-0.1%Cu | 16.1 | 75.0 | 8.9 | 34.2 | 52.1 | 13.7 |
| Ag-3.5%Pd-0.1%Cu | 16.2 | 74.1 | 9.7 | 35.1 | 52.5 | 12.4 |
| Ag-3.0%Pd-0.5%Cu | 15.9 | 74.4 | 9.7 | 34.6 | 53.0 | 12.4 |
| Ag-3.0%Pd-1.0%Cu | 14.9 | 74.8 | 10.3 | 34.5 | 52.5 | 13.0 |
| Ag-3.0%Pd-1.5%Cu | 15.5 | 74.5 | 10.0 | 34.7 | 52.7 | 12.6 |
| Ag-3.0%Pd-2.0%Cu | 15.7 | 74.6 | 9.7 | 35.1 | 53.2 | 11.7 |
| Ag-3.0%Pd-2.5%Cu | 16.2 | 73.8 | 10.0 | 34.2 | 52.3 | 13.5 |
| Ag-3.0%Pd-3.0%Cu | 15.4 | 72.9 | 11.7 | 34.6 | 53.1 | 12.3 |
| Ag-3.0%Pd-3.5%Cu | 15.2 | 72.0 | 12.8 | 34.2 | 52.1 | 13.7 |
| Ag-0.1%Pd-0.1%Ti | 13.6 | 75.4 | 11.0 | 34.5 | 52.4 | 13.1 |
| Ag-0.5%Pd-0.1%TI | 13.5 | 74.8 | 11.7 | 34.2 | 51.6 | 14.2 |
| Ag-1.0%Pd-0.1%Ti | 12.9 | 74.9 | 12.2 | 34.8 | 51.8 | 13.4 |
| Ag-1.5%Pd-0.1%Ti | 13.3 | 74.5 | 12.2 | 35.1 | 52.5 | 12.4 |
| Ag-2.0%Pd-0.1%Ti | 13.1 | 74.1 | 12.8 | 33.9 | 51.9 | 14.2 |
| Ag-2.5%Pd-0.1%Ti | 12.6 | 73.7 | 13.7 | 34.3 | 52.1 | 13.6 |
| Ag-3.0%Pd-0.1%Ti | 11.9 | 73.2 | 14.9 | 34.5 | 52.3 | 13.2 |
| Ag-3.5%Pd-0.1%Ti | 12.5 | 73.3 | 14.2 | 34.8 | 51.8 | 13.4 |

TABLE 3-continued

| | Wavelength of 400 nm | | | Wavelength of 650 nm | | |
| --- | --- | --- | --- | --- | --- | --- |
| | Reflectance [%] | Transmittance [%] | Absorbance [%] | Reflectance [%] | Transmittance [%] | absorbance [%] |
| Ag-3.0%Pd-0.5%Ti | 11.4 | 72.5 | 16.1 | 34.6 | 51.9 | 13.5 |
| Ag-3.0%Pd-1.0%Ti | 11.0 | 73.1 | 15.9 | 34.2 | 51.8 | 14.0 |
| Ag-3.0%Pd-1.5%Ti | 11.1 | 72.9 | 16.0 | 33.1 | 52.1 | 14.8 |
| Ag-3.0%Pd-2.0%Ti | 10.8 | 72.4 | 16.8 | 33.5 | 51.5 | 15.0 |
| Ag-3.0%Pd-2.5%Ti | 10.5 | 72.8 | 16.7 | 32.7 | 52.0 | 15.3 |
| Ag-3.0%Pd-3.0%Ti | 10.6 | 73.0 | 16.4 | 33.0 | 51.6 | 15.4 |
| Ag-3.0%Pd-3.5%Ti | 10.5 | 72.9 | 16.6 | 32.4 | 51.5 | 16.1 |

The aforesaid ranges of effective film thicknesses apply almost without correction to the compositions of Table 3 having optical properties close to those of the Ag thin film. However, the results obtained by the measurement at a wavelength of 400 nm of thin films of AgPdTi alloys having a larger Ti content remarkably differ from the results of the Ag film. In these AgPdTi alloys, the reflectance drops by 5% and the absorbance increases by 8% at maximums. If the optical properties of the alloys deviate from those of the Ag thin film as described above, correction of the film thickness range is necessary.

Figure 4:
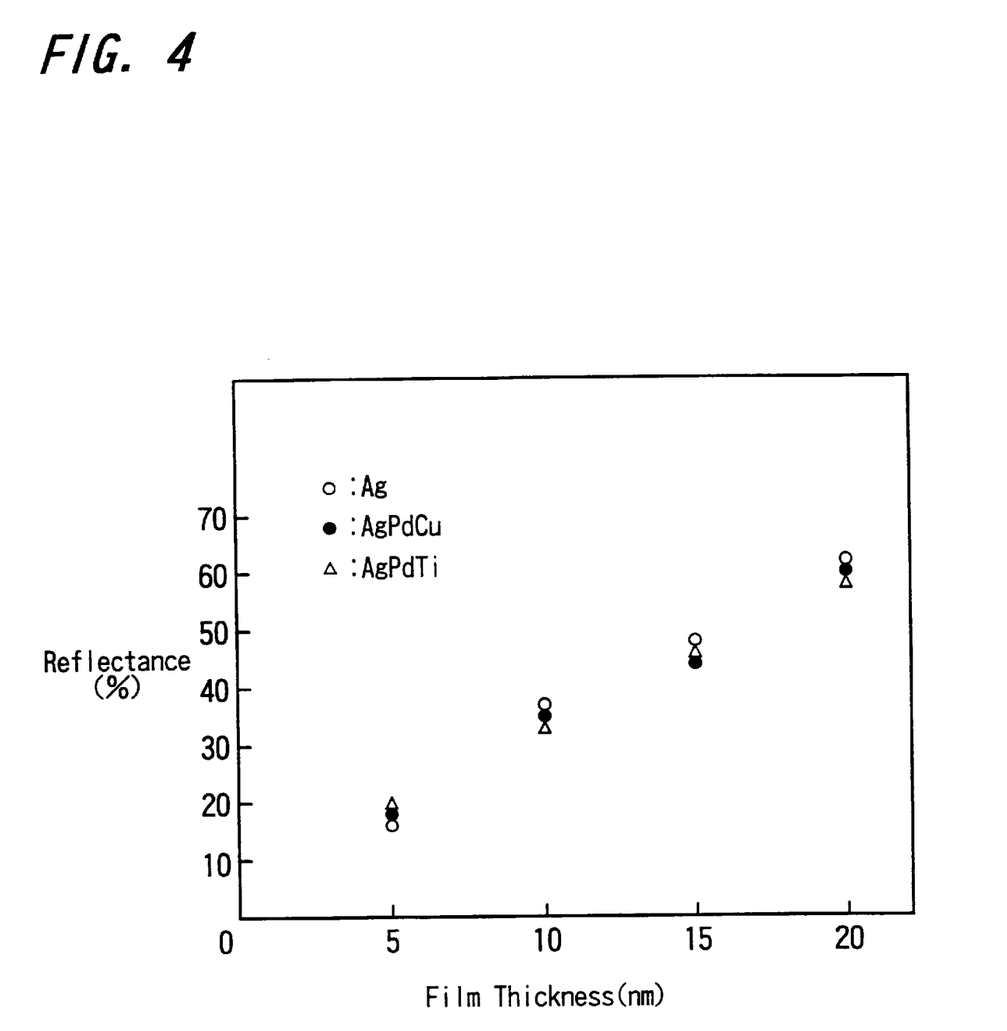
FIG. 4 is a graph which illustrates the relationship between the reflectance (%) and a film thickness (nm) of Ag, an alloy comprising Ag, 1.2 weight % Pd and 1.3 weight % Cu, and an alloy comprising Ag, 1.2 weight % Pd and 1.3 weight % Ti, shown in Table 2.

FIG. 4 is a graph which illustrates the relationship between the reflectance (%) and film thickness (nm) of Ag, an alloy comprising Ag, 1.2 weight % Pd and 1.3 weight % Cu, and an alloy comprising Ag, 1.2 weight % Pd and 1.3 weight % Ti, given in Table 2. As can be seen from FIG. 4, the reflectance is proportional to the film thickness within the range of these thicknesses.

Meanwhile, as explained with FIG. 2, if the film thickness is 5 nm, the quantity of returning light S1 can be 10% at a wavelength of 650 nm. On the other hand, as can be seen from Table 3, whereas the reflectance of the Ag thin film is 35.5%, the smallest reflectance of AgPdCu alloys containing 0.5 to 3.0 weight % Pd and 0.1 to 3.0 weight % Cu is 34.2% at a wavelength of 650 nm. What is necessary for increasing the reflectance from 34.2% to 35.5% is to increase the film thickness by a corresponding margin. The necessary film thickness is given by the following equation: 35.5/34.2×5= 5.2, from which 5 nm is obtained by rounding off to the whole number. Based on this ground, the minimum required film thickness in AgPdCu alloys containing 0.5 to 3.0 weight % Pd and 0.1 to 3.0 weight % Cu is 5 nm.

The result of a similar calculation with AgPdTi alloys containing 0.5 to 3.0 weight % Pd and 0.1 to 3.0 weight % Ti is 35.5/32.7×5=5.4, from which 5 nm is obtained by rounding off to the whole number. Based on this ground, the minimum required film thickness in AgPdTi alloys containing 0.5 to 3.0 weight % Pd and 0.1 to 3.0 weight % Ti is 5 nm.

As can be seen from FIG. 2, the maximum Ag film thickness at a wavelength of 650 nm is 18 nm, with the proviso that the quantity of returning light S2 is 10% or more. The quantity of returning light S2 is proportional to the square of the transmittance of the semitransparent reflective film.

On the other hand, as can be seen from Table 3, whereas the transmittance of the Ag thin film is 51.2%, the transmittance of AgPdCu alloys containing 0.5 to 3.0 weight % Pd and 0.1 to 3.0 weight % Cu or the transmittance of AgPdTi alloys containing 0.5 to 3.0 weight % Pd and 0.1 to 3.0 weight % Ti is greater than 51.2%. From this fact, it is clear that the quantity of returning light S2 of alloys other than Ag is greater than the quantity of returning light S2 of Ag. Accordingly, the maximum film thickness does not exceed 18 nm.

Based on this ground, the maximum required film thickness in AgPdCu alloys containing 0.5 to 3.0 weight % Pd and 0.1 to 3.0 weight % Cu is 18 nm.

Likewise, the maximum required film thickness in AgPdTi alloys containing 0.5 to 3.0 weight % Pd and 0.1 to 3.0 weight % Ti is 18 nm.

The above results are summed up as follows. At a wavelength of 650 nm, an optimum film thickness of AgPdCu alloys containing 0.5 to 3.0 weight % Pd and 0.1 to 3.0 weight % Cu is in the range of from 5 to 18 nm.

In addition, at a wavelength of 650 nm, an optimum film thickness of AgPdTi alloys containing 0.5 to 3.0 weight % Pd and 0.1 to 3.0 weight % Ti is in the range of from 5 to 18 nm.

The results at a wavelength of 400 nm are discussed below.

As explained with FIG. 3, at a wavelength of 400 nm, the quantity of returning light S1 of 10% can be secured if the film thickness is 10 nm. Meanwhile, the reflectance of Ag at a film thickness of 10 nm is 15.4% in Table 3. In this case, the quantity of returning light S1 is 10%.

The smallest reflectance of AgPdCu alloys containing 0.5 to 3.0 weight % Pd and 0.1 to 3.0 weight % Cu is 14.9%. The necessary film thickness is given by the following equation: 15.4/14.9×10=10.3, from which 10 nm is obtained by rounding off to the whole number. Based on this ground, the minimum required film thickness in AgPdCu alloys containing 0.5 to 3.0 weight % Pd and 0.1 to 3.0 weight % Cu is 10 nm.

Next, similar calculations are conducted with AgPdTi alloys containing 0.5 to 3.0 weight % Pd and 0.1 to 3.0 weight % Ti.

According to a similar calculation conducted with an AgPdTi alloy containing 0.5 weight % Pd and 0.1% Ti, the minimum film thickness is 11 nm.

According to a similar calculation conducted with an AgPdTi alloy containing 0.5 to 2.0 weight % Pd and 0.1 weight % Ti, the minimum film thickness is 12 nm.

According to a similar calculation conducted with an AgPdTi alloy containing 0.5 to 3.0 weight % Pd and 0.1 weight % Ti, the minimum film thickness is 13 nm.

According to a similar calculation conducted with an AgPdTi alloy containing 0.5 to 3.0 weight % Pd and 0.1 to 1.5 weight % Ti, the minimum film thickness is 14 nm.

According to a similar calculation conducted with an AgPdTi alloy containing 0.5 to 3.0 weight % Pd and 0.1 to 3.0 weight % Ti, the minimum film thickness is 15 nm.

Meanwhile, in FIG. 3, the maximum film thickness of Ag at a wavelength of 400 nm was 26 nm by way of extrapolation of the curve indicating the quantity of returning light S2. At this thickness, the transmittance of Ag is 75.8%. on the other hand, the smallest transmittance of AgPdCu alloys containing 0.5 to 3.0 weight % Pd and 0.1 to 3.0 weight %

Cu is 72.9%. On the assumption that the transmittance is inversely proportional to the film thickness, the necessary maximum film thickness is given by the following equation: 72.9/75.8×26=25.0. Based on this ground, the maximum required film thickness in AgPdCu alloys containing 0.5 to 3.0 weight % Pd and 0.1 to 3.0 weight % Cu is 25 nm.

A similar calculation was made with AgPdTi alloys containing 0.5 to 3.0 weight % Pd and 0.1 to 3.0 weight % Ti. According to the result, the maximum required film thickness in AgPdTi alloys containing 0.5 to 3.0 weight % Pd and 0.1 to 3.0 weight % Ti is 25 nm.

The above results are summed up as follows. At a wavelength of 400 nm, an optimum film thickness of AgPdCu alloys containing 0.5 to 3.0 weight % Pd and 0.1 to 3.0 weight % Cu is in the range of from 10 to 25 nm.

In addition, at a wavelength of 400 nm, an optimum film thickness of AgPdTi alloys containing 0.5 weight % Pd and 0.1 weight % Ti is in-the range of from 11 to 25 nm.

At a wavelength of 400 nm, an optimum film thickness of AgPdTi alloys containing 0.5 to 2.0 weight % Pd and 0.1 weight % Ti is in the range of from 12 to 25 nm.

At a wavelength of 400 nm, an optimum film thickness of AgPdTi alloys containing 0.5 to 3.0 weight % Pd and 0.1 weight % Ti is in the range of from 13 to 25 nm.

At a wavelength of 400 nm, an optimum film thickness of AgPdTi alloys containing 0.5 to 3.0 weight % Pd and 0.1 to 1.5 weight % Ti is in the range of from 14 to 25 nm.

At a wavelength of 400 nm, an optimum film thickness of AgPdTi alloys containing 0.5 to 3.0 weight % Pd and 0.1 to 3.0 weight % Ti is in the range of from 15 to 25 nm.

In AgPdCu alloys containing 0.5 to 3.0 weight % Pd and 0.1 to 3.0 weight % Cu, an optimum film thickness compatible simultaneously with both of the wavelengths of 400 nm and 650 nm is in the range of from 10 to 18 nm.

In AgPdTi alloys containing 0.5 weight % Pd and 0.1 weight % Ti, an optimum film thickness compatible simultaneously with both of the wavelengths of 400 nm and 650 nm is in the range of from 11 to 18 nm.

In AgPdTi alloys containing 0.5 to 2.0 weight % Pd and 0.1 weight % Ti, an optimum film thickness compatible simultaneously with both of the wavelengths of 400 nm and 650 nm is in the range of from 12 to 18 nm.

In AgPdTi alloys containing 0.5 to 3.0 weight % Pd and 0.1 weight % Ti, an optimum film thickness compatible simultaneously with both of the wavelengths of 400 nm and 650 nm a is in the range of from 13 to 18 nm.

In AgPdTi alloys containing 0.5 to 3.0 weight % Pd and 0.1 to 1.5 weight % Ti, an optimum film thickness compatible simultaneously with both of the wavelengths of 400 nm and 650 nm is in the range of from 14 to 18 nm.

In AgPdTi alloys containing 0.5 to 3.0 weight % Pd and 0.1 to 3.0 weight % Ti, an optimum film thickness compatible simultaneously with both of the wavelengths of 400 nm and 650 nm is in the range of from 15 to 18 nm.

Based on the above-described results of the weather resistance test and the measurements of optical properties in the embodiments of the present invention, the weather resistance and adhesion to substrates can be improved by the use of a thin film of AgPdCu alloy or AgPdTi alloy, which comprises Ag as a base material and 0.5 to 3.0 weight % Pd together with 0.1 to 3.0 weight % Cu or Ti as a third element, in the semitransparent reflective film. As a result, a higher reliability can be obtained.

If the film thickness of the semitransparent is set to a value within a specific range, it is possible to obtain an optical data storage medium capable of carrying out a stable reproduction in a condition that the wavelength employed is either 650 nm or 400 nm or in a condition that the wavelengths employed are 650 nm and 400 nm. Needless to say, stable reproduction is possible at a wavelength between 650 nm and 400 nm.

Since the solutionization of an alloy within the above-mentioned compositional range is easy, it is possible to prepare a sputtering target whose composition is homogeneous even in a minute region thereof. Therefore, the use of this sputtering target makes it possible to prepare a thin film whose composition is homogeneous even in a minute region thereof.

In the embodiments of the present invention, the explanation is directed to the use as a semitransparent reflective film of a thin film of AgPdCu alloy or AgPdTi alloy which comprises Ag as a base material and 0.5 to 3.0 weight % Pd together with 0.1 to 3.0 weight % Cu or Ti as a third element. However, the third element is not limited to Cu or Ti. Naturally, other metal, such as Cr, Au, Al, Rh, or the like, can also be employed.

In the embodiments of the present invention, the explanation is directed to an optical disk which is a so-called discoid optical disk having two information layers. However, the present invention is not limited to such an optical disk or shape. Therefore, the present invention is applicable to various optical data storage media having a thin metal film in an information layer. Exemplary of the media are optical disks having a single information layer or three or more information layers, photo-electro-magnetic disks, phase change-type optical disks, and card- or sheet-like data storage media.

In addition, various constructions are possible for the optical data storage medium. For example, the optical data storage medium may comprise two transparent substrates each having two or more information layers wherein the transparent substrates are combined such that the information layers face each other and wherein the two transparent substrates are to be irradiated with light.

The present invention is not limited to the embodiments described above. Therefore, the present invention may take other various constitutions without a departure from the spirit of the present invention.

The present invention provides the following effects.

Since the semitransparent reflective film comprises a thin film of an AgPdCu alloy containing 0.5 to 3.0 weight % Pd and 0.1 to 3.0 weight % Cu or a thin film of an AgPdTi alloy containing 0.5 to 3.0 weight % Pd and 0.1 to 3.0 weight % Ti, it is possible to improve weather resistance of the semitransparent reflective film and to upgrade the adhesion between the semitransparent reflective film and the substrate. As a result, a higher reliability can be obtained.

In addition, an optical data storage medium capable of carrying out stable reproduction can be obtained by setting the thickness of the semitransparent reflective film to a specific value.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. An optical data storage medium comprising a total of two or more layers in which an information layer having a semitransparent reflective film and an information layer having a reflective film are laminated, said optical date storage medium being capable of performing at least one operation selected from recording of information and reproduction of information by light radiation from the same direction, wherein the semitransparent reflective film comprises a thin film of an AgPdCu alloy containing 0.5 to 3.0 weight % Pd and 0.1 to 3.0 weight % Cu.

2. An optical data storage medium according to claim 1, wherein the thickness of the semitransparent reflective film is 10 to 25 nm.

3. An optical data storage medium according to claim 1, wherein the thickness of the semitransparent reflective film is 5 to 18 nm.

4. An optical data storage medium comprising a total of two or more layers in which an information layer having a semitransparent reflective film and an information layer having a reflective film are laminated, said optical date storage medium being capable of performing at least one operation selected from recording of information and reproduction of information by light radiation from the same direction, wherein the semitransparent reflective film comprises a thin film of an AgPdTi alloy containing 0.5 to 3.0 weight % Pd and 0.1 to 3.0 weight % Ti.

5. An optical data storage medium according to claim 4, wherein the thickness of the semitransparent reflective film is 15 to 25 nm.

6. An optical data storage medium according to claim 4, wherein the thickness of the semitransparent reflective film is 5 to 18 nm.

* * * * *